(12) United States Patent
Overall et al.

(10) Patent No.: US 10,254,369 B2
(45) Date of Patent: Apr. 9, 2019

(54) PIPELINE ENGINE FOR SPECIFYING, VISUALIZING, AND ANALYZING MRI IMAGE RECONSTRUCTIONS

(71) Applicant: HEARTVISTA, INC., Menlo Park, CA (US)

(72) Inventors: William Overall, Menlo Park, CA (US); Juan Santos, Palo Alto, CA (US)

(73) Assignee: HeartVista, Inc., Menlo Park, CA (US)

( * ) Notice: Subject to any disclaimer, the term of this patent is extended or adjusted under 35 U.S.C. 154(b) by 572 days.

(21) Appl. No.: 14/924,864

(22) Filed: Oct. 28, 2015

(65) Prior Publication Data
US 2016/0259023 A1    Sep. 8, 2016

Related U.S. Application Data

(60) Provisional application No. 62/069,976, filed on Oct. 29, 2014.

(51) Int. Cl.
| | |
|---|---|
| *G01R 33/56* | (2006.01) |
| *G06T 11/00* | (2006.01) |
| *G06T 1/20* | (2006.01) |
| *G01R 33/54* | (2006.01) |
| *G06T 11/20* | (2006.01) |

(52) U.S. Cl.
CPC ....... *G01R 33/5608* (2013.01); *G01R 33/546* (2013.01); *G06T 1/20* (2013.01); *G06T 11/206* (2013.01); *G06T 2200/24* (2013.01)

(58) Field of Classification Search
None
See application file for complete search history.

(56) References Cited

U.S. PATENT DOCUMENTS

| | | |
|---|---|---|
| 3,025,717 A | 3/1962 | Christenson |
| 5,465,361 A | 11/1995 | Hoenninger, III |

(Continued)

FOREIGN PATENT DOCUMENTS

| | | |
|---|---|---|
| WO | WO-2005008269 A1 | 1/2005 |
| WO | WO-2014039080 A1 | 3/2014 |

OTHER PUBLICATIONS

Santos, et al. Flexible real-time magnetic resonance imaging framework. Conf Proc IEEE Eng Med Biol Soc. Sep. 1-5, 2004;2:1048-51. doi: 10.1109/IEMBS.2004.1403343.

*Primary Examiner* — Jermele M Hollington
(74) *Attorney, Agent, or Firm* — Wilson Sonsini Goodrich and Rosati, P.C.

(57) ABSTRACT

Systems and methods are provided for the imaging of a subject (e.g., patient). A pipeline architecture is presented that facilitates the development of high-quality, application-specific data reconstructions. A plurality of processing nodes is provided, each node comprising one or more processing tasks for data transformation. Two or more processing nodes are linked together to form a functional pipeline, each pipeline configured to generate image data from a raw image data set, such as raw magnetic resonance imaging data. The generated image data is used to generate the image of the subject. The processing nodes and the functional pipeline can be dynamically reconfigured to optimize the computing resources used. The processing nodes and the pipeline may be visualized and queried to facilitate debugging and the configuration of an image processing procedure.

24 Claims, 10 Drawing Sheets

(56) References Cited

U.S. PATENT DOCUMENTS

| | | | |
|---|---|---|---|
| 5,513,825 A | 5/1996 | Gutgsell | |
| 6,020,739 A | 2/2000 | Meyer et al. | |
| 6,198,282 B1 | 3/2001 | Dumoulin | |
| 6,198,283 B1* | 3/2001 | Foo | G01R 33/561 |
| | | | 324/307 |
| 7,053,614 B2 | 5/2006 | Hornung | |
| 7,102,349 B2 | 9/2006 | Hornung | |
| 7,759,934 B2* | 7/2010 | Miyoshi | G01R 33/4828 |
| | | | 324/307 |
| 8,073,225 B2* | 12/2011 | Hagen | G01R 33/3621 |
| | | | 345/629 |
| 9,784,805 B2* | 10/2017 | Saes | G01R 33/341 |
| | | | 324/300 |
| 2001/0029505 A1* | 10/2001 | Gaudette | G11B 27/034 |
| 2007/0120565 A1* | 5/2007 | Iwadate | G01R 33/56308 |
| | | | 324/318 |
| 2008/0205432 A1* | 8/2008 | Gangwal | H04L 45/40 |
| | | | 370/458 |
| 2008/0231273 A1* | 9/2008 | Kabasawa | G01R 33/56 |
| | | | 324/309 |
| 2014/0164444 A1* | 6/2014 | Bowen | G06F 17/3007 |
| | | | 707/821 |
| 2014/0301622 A1* | 10/2014 | Forman | G06T 11/005 |
| | | | 382/131 |
| 2017/0038452 A1* | 2/2017 | Trzasko | G01R 33/56572 |
| 2017/0052241 A1* | 2/2017 | Cetingul | G01R 33/56341 |
| 2018/0292488 A1* | 10/2018 | Moeller | G01R 33/4836 |

* cited by examiner

PIPELINE ENGINE FOR SPECIFYING, VISUALIZING, AND ANALYZING MRI IMAGE RECONSTRUCTIONS

CROSS-REFERENCE

This application claims the benefit of U.S. Provisional Application No. 62/069,976, filed Oct. 29, 2014, which application is entirely incorporated herein by reference.

STATEMENT AS TO FEDERALLY SPONSORED RESEARCH

This invention was made with the support of the United States government under contract number R44 HL084769 by NIH NHLBI. The government has certain rights in the invention.

BACKGROUND

Magnetic resonance imaging (MRI) reconstruction algorithms have progressed dramatically in their complexity and requirements in recent years. In the early years of MRI, raw image data were reconstructed using little more than multi-dimensional Fourier transforms. Subsequently, partial-data acquisition schemes, parallel imaging, compressed sensing, real-time progressive updating, non-Cartesian data acquisition, gradient hardware warp correction, concomitant gradient corrections, de-noising, fat-water separation schemes, and many other advanced computational algorithms have been developed and applied to MRI data reconstructions. For any given disease, functional process, or anatomic feature of interest, different combinations and variations on these reconstruction algorithms may be used in order to produce images with the highest possible diagnostic value.

In some cases, the most time-consuming parts of creating such new algorithms are debugging, parallelization, and memory management.

SUMMARY

Recognized herein is the need for systems and methods that can reduce the time required to complete essential operations in magnetic resonance imaging (MRI) processing, such as generating new machine-executable algorithms for various diagnostics applications, including MRI data or image reconstruction.

The present disclosure provides methods and systems for medical imaging. Methods and systems provided herein may be employed for use with medical imaging and/or diagnostic procedures and systems, such as MRI.

The present disclosure provides systems and methods to facilitate the development of high-quality, application-specific MRI reconstructions. Embodiments of the present disclosure include a reconstruction pipeline architecture that can allow the MRI application designer to easily specify the precise method of application of these algorithms to the raw data for the purpose at hand. Algorithms may be parsed down into functional nodes, node properties may be specified through the data, and nodes may be chained together to form a pipeline.

This pipeline approach can lead to several advantages for the developer, including automatically assigning memory and processing resources through analysis of the pipeline topology, allowing flexible re-use of common algorithms, etc.

Pipelines can be specified in any language, but a high-level scripting language like Python or JavaScript may be preferred to facilitate rapid development cycles. While pipelines can be built using graphical tools, this may be more cumbersome than programming because logical operations may often be applied (e.g., a number of similar pipeline branches can be easily specified in a loop, or a pipeline segment can dynamically reorganize itself based upon data contents).

While pipelines are most conveniently specified in computer code, there may be significant value in having the ability to graphically view the pipeline, query the status of each of its nodes and connections, and to specify debugging operations directly on this graphical view. Debugging operations can provide a "hit counter" that counts the number of times data passes through a connection during an operating interval, "breakpoints" that halt data flow through a portion of the pipeline awaiting a command to continue from the user, and others detailed below.

Debugging operations available on the pipeline view itself can significantly increase the speed of development of new MRI reconstructions, and allow for quality assurance through ensuring that segments of the pipeline operate as designed. Debugging can be added programmatically or graphically.

These tools—a highly scalable, efficient reconstruction pipeline infrastructure; a pipeline visualizer; and integrated debugging tools—together provide a highly advanced platform for rapidly creating new application-specific MRI reconstruction algorithms. As the field of MRI reconstruction continues to produce ever more algorithms to improve results, this unique method for managing complexity while facilitating rapid translation to clinical practice may become ever more necessary.

Aspects of the present disclosure provide methods for imaging a subject (e.g., patient). Such a method may comprise using an imaging apparatus to condition nuclear spins in a subject, and measure the radiofrequency signals generated from the subject in response to the conditioned nuclear spins. The method may further comprise using a computing system in communication with the imaging apparatus to compile the measured radiofrequency signals into a raw data set, then generating an image of the subject based on the raw data. The method may further comprise displaying the generated image on a display of the computing system. Generating the image of the subject based on the data set may comprise sub-operations of: providing a plurality of processing nodes, where each node comprises one or more processing tasks for data transformation; linking two or more of the processing nodes to form a functional pipeline, wherein the pipeline is configured to generate image data from the raw data set and the generated image data is used to generate the image of the subject; and prioritizing a computing resource of the computing system for one or more select processing nodes of the functional pipeline, based on one or more of an input, output, content, or node connection attribute of the select processing nodes, a topology of the functional pipeline, or a user instruction.

The prioritized computing resource may comprise one or more of a processing resource, a memory resource, one or more computer workstations, one or more central processing unit (CPU) processing cores, one or more graphics processing unit (GPU) threads, or one or more stream processors of the computing system. The operation of prioritizing the computer resource may comprise dynamically reconfiguring the functional pipeline based on one or more of an input, an output, content, a node connection attribute of the one or more select processing nodes, a topology of the functional pipeline, or a user instruction. The content of the one or more select processing nodes may comprise one or more of complex-valued data arranged in one or more dimensions, or metadata relevant to at least one of the collection, processing, display, or patient characteristics related to the one or more select processing nodes. In some embodiments, the computing resource may be prioritized using a pool scheduler.

To generate the image of the subject based on the data set, the method may further comprise displaying, on the display of the computing device, a graphical user interface showing at least a portion of the functional pipeline, wherein the graphical user interface allows the user to query at least one of the linked processing nodes or a node connection between two linked processing nodes. In some embodiments, the linked processing nodes or node connections between two linked processing nodes may be queried by using a tracepoint. A tracepoint may comprise one or more of a hit counter, breakpoint, data size, plot data, image data, information key, recon latency, thread usage, log completion, save to file, modify data, insert delay, memory allocation, or throughput. In some embodiments, the graphical user interface may provide a visual tool for at least one of debugging or documentation. In some embodiments, the graphical user interface may display a timing diagram of at least one of the conditioning or measuring operations.

Aspects of the present disclosure also provide systems for imaging a patient or a subject. Such a system may comprise an imaging apparatus configured to condition nuclear spins in a subject and measure radiofrequency signals generated from the subject in response to the conditioned nuclear spins. The system may also comprise a computing system in communication with the imaging apparatus. The computing system may comprise a memory storing a set of instructions that, when executed by a processor of the computing system, causes the computing system to compile the measured radiofrequency systems into a raw data set, generate an image of the subject based on the raw data set, and display the generated image. Generating the image of the subject may comprise the sub-operations of: providing a plurality of processing nodes, each comprising one or more processing tasks for data transformation; linking two or more of the processing nodes to form a functional pipeline, wherein the pipeline is configured to generate image data from the raw data set and the generated image data is used to generate the image of the subject; and prioritizing a computing resource of the computing system for one or more select processing nodes of the functional pipeline, based on one or more of an input, output, content, or node connection attribute of the select processing nodes, a topology of the functional pipeline, or a user instruction.

The prioritized computing resource may comprise one or more of a processing resource, a memory resource, one or more computer workstations, one or more CPU processing cores, one or more GPU threads, or one or more steam processors of the computing system. The operation of prioritizing the computer resource may comprise dynamically reconfiguring the functional pipeline based on one or more of an input, an output, a content, a node connection attribute of the one or more select processing nodes, a topology of the functional pipeline, or a user instruction. The content of the one or more select processing nodes may comprise one or more of complex-valued data arranged in one or more dimensions, or metadata relevant to at least one of the collection, processing, display, or patient characteristics related to the one or more select processing nodes. In some embodiments, the computing resource may be prioritized using a pool scheduler.

To generate the image of the subject based on the data set, the set of instructions may include operations for displaying, on the display of the computing device, a graphical user interface showing at least a portion of the functional pipeline, wherein the graphical user interface allows the user to query at least one of the linked processing nodes or a node connection between two linked processing nodes. In some embodiments, the linked processing nodes or node connections between two linked processing nodes may be queried by using a tracepoint. A tracepoint may comprise one or more of a hit counter, breakpoint, data size, plot data, image data, information key, recon latency, thread usage, log completion, save to file, modify data, insert delay, memory allocation, or throughput. In some embodiments, the graphical user interface may provide a visual tool for at least one of debugging or documentation. In some embodiments, the graphical user interface may display a timing diagram of at least one of the conditioning or measuring operations.

One or more of the above operations may involve one or more transformations or alterations of the information or data. For instance, the generation of the image may involve one or more transformations or alterations of the raw image data, and the display of the generated image may involve one or more transformations or alterations of the generated image data.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present disclosure will be obtained by reference to the following detailed description that sets forth illustrative embodiments, in which the principles of the present disclosure are utilized, and the accompanying drawings of which:

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

The present disclosure provides systems and methods to facilitate the development of high-quality, application-specific Magnetic Resonance Imaging (MRI) reconstructions. An exemplary system to facilitate the development of MRI reconstructions, also referred to as the RTHawk reconstruction engine herein, may comprise a collection of image processing algorithms specially designed for MRI data reconstruction. The reconstruction engine may encompass a number of key design concepts.

The engine may be data driven: unlike traditional MRI reconstruction systems where data is reconstructed after it is acquired, in this system, data may be processed while being acquired. The reconstruction may comprise an integral part of the acquisition system.

The engine may comprise a pipeline architecture. As data is typically treated as streams, a natural representation of the algorithms and flow of data may be in a pipeline architecture. Each operation in the reconstruction process may be connected by the data that is flowing.

The engine may utilize parallel processing. The pipeline architecture may provide a natural environment for parallel processing. Each branching may be an opportunity for parallelization.

The engine may comprise a modular design. Each node in the pipeline may comprise an individual module. New modules can be developed by the end user and added to the reconstruction process.

The engine may be scriptable. The reconstruction pipeline may be described by an embedded scripting language based on, for example, ECMAScript. This may allow for maximum flexibility in the design of reconstruction algorithms but at the same time may maintain high performance by relegating the data processing to the pipeline nodes.

The engine may have configurable input and output. Data sources and sinks may be fully configurable, allowing reading data from various sources including MRI scanners, data files, custom data acquisition systems, etc. The pipeline may operate as a stream processor, permitting reconstruction of data as it arrives. Continuous data acquisitions, including real-time and motion-navigated scans, can be easily handled by this architecture.

The engine may have scan control capability. Capability may be provided to control the data acquisition system. For example, based on reconstruction data it may be possible to modify the readout gradients to correct for off-resonance distortions.

Figure 1:
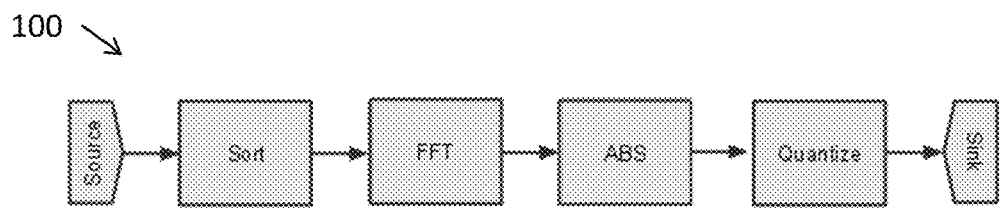
FIG. 1 shows a schematic of a simple pipeline designed to reconstruct a single two-dimensional Fourier transform (2DFT) image, in accordance with some embodiments.

The reconstruction pipeline may perform operations on Data objects to produce reconstructed data. After reconstruction, data may be quantized for display and storage. Special conversion modules can perform this translation. FIG. 1 shows a simple pipeline 100 designed to reconstruct a single two-dimensional Fourier transform (2DFT) image.

Data may be passed through the pipeline 100 between Node objects via Connection objects. Each Connection object may connect one node output to a single node input. In this section of the pipeline 100, data and related meta-information may be passed using Data objects.

A node is typically the basic building block of a reconstruction. Typically, all processing occurs in nodes, and control flow and parallelization may be managed by the node class infrastructure. Node classes are typically subclassed to provide the desired algorithmic functionality (see below).

A Connection object may specify how node outputs and node inputs pass data to one another. Connection objects may represent only one path for data flow, and may ensure that the next node in the pipeline is notified appropriately when new data are available. For efficiency, the Connection objects may reclaim memory allocated by passed data when no longer needed. The Connection object can also provide signaling when data values are modified, and can flexibly allow debugging operations. In preferred embodiments, connection objects are not subclassed.

Data objects as passed through the pipeline may represent a block of multidimensional complex-valued floating-point data. In addition to this data and dimensional parameters, Data objects may also provide a key-value store of Information objects for arbitrary additional information about the acquisition parameters, subject (e.g., patient), MRI hardware, user settings, and any other metadata that may be useful to the reconstruction. Nodes may operate on Data and related Information arbitrarily as the Data passes through the pipeline.

Pipeline Node

Figure 2:
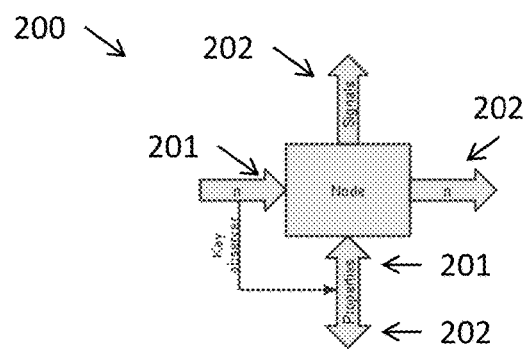
FIG. 2 shows a schematic of a pipeline node, in accordance with some embodiments.

FIG. 2 shows a schematic of a pipeline node 200. Each node 200 may have "n" potential inputs 201 and outputs 202 but each connection typically represents a single data object. To connect a single output 202 to multiple inputs 201 (for example to different nodes), a special splitter node may be used that has a single input 201 and forwards the data to multiple outputs 202.

Data arriving at the input 201 of a node 200 or connection may drive the propagation of the algorithm through the pipeline. This method of propagation can be known as a data driven architecture. Data inputs 201 to each node 200 may trigger the execution of the algorithm. Data inputs 201 to each connection may trigger a notification of available data to the output node.

In addition to the connections, each node 200 has properties and signals. Properties may be used to set any arbitrary state of each node that may be asynchronous with the data. Properties can be set manually or can be directly extracted from the information contained within the data using a "key observer" approach. A node 200 can also emit a signal that can then be connected to a property of another node or can be set to update a user-interface element.

Hierarchy

Figure 3:
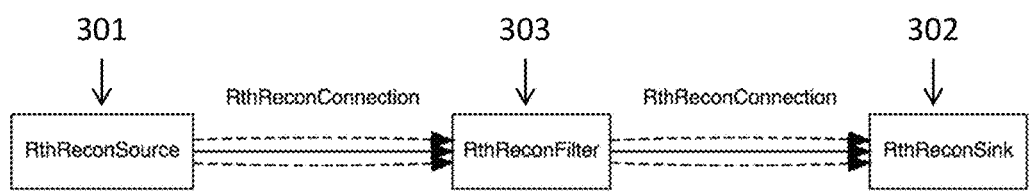
FIG. 3 shows a schematic of three node-related classes, in accordance with some embodiments.

Nodes with inputs or outputs can be categorized into three types: sources 301, sinks 302, and filters 303. FIG. 3 shows a schematic of the three node-related classes.

Sources 301 typically have pipeline outputs only, and may act as the starting points for the pipeline. Sources 301 may receive data from a socket connection, simulated data generator, or any other method by which Data may be brought into the pipeline. A single pipeline may work from multiple sources.

Sinks 302 typically have pipeline inputs only, and may act as the endpoints of the pipeline. Sinks 302 may convert data to numerical values, images or graphs suitable for display, or may provide signals that can inform future data acquisition or other pipelines (e.g., linear fitting coefficients). A single pipeline may have multiple sinks 302.

Filters 303 can have both inputs and outputs, and thereby may combine the functionalities of sources 301 and sinks 302. Filters are typically the most common building blocks of a reconstruction pipeline, performing a specific transformation on the input Data and passing the result to the output Connections.

Each of these types can be provided in the abstract; specific processing nodes inherit the properties of these node types and perform a specific function. The standard pipeline engine may contain hundreds of concrete Node types for standard algebraic operations (e.g., absolute value, sin, cos, exponentiation, multiplication, etc.), flow control (e.g., splitters, combiners, switches, multiplexers, etc.), optimizations (e.g., least-squares fits, iterative minimizers, etc.) as well as MRI-specific block types (e.g., parallel imaging, compressed sensing, fat/water separation, etc.). A plugin application programming interface (API) can be provided so that users may define their own block types inheriting from these base types to further extend the functionality of the pipeline engine.

The Reconstruction Script

The reconstruction pipeline can be declared in a simple script using the ECMAScript (JavaScript) language. The reconstruction algorithm may be expressed in a declarative programming paradigm, where the algorithm is described as a series of mathematical operations without specifying how each operation is accomplished or explicitly describing the control flow.

Specifying the pipeline in this manner may allow a relatively slow scripting language to be used in setting up the pipeline topology, but fast-compiled languages can be utilized to carry out the actual computation. Dynamic changes to pipeline architecture can also be flexibly created through the script. If desired, all scripted content may also be compiled to further improve setup performance at the expense of programming simplicity.

As an example, the pipeline 100 of FIG. 1 can be specified using the following JavaScript:

```
var source = new RthReconObserver( );
var sort = new RthReconSort( );
sort.setPhaseEncodes(256);
sort.setSamples(256);
sort.setInput(source.output( ));
var fft = new RthReconFFT( );
fft.observeValueForKey("reconstruction.chop", "yChop");
fft.setInput(sort.output( ));
var abs = new RthReconAbs( );
abs.setInput(fft.output( ));
var quantize = new RthReconImageToRthDisplayImage( );
quantize.setInput(abs.output( ));
quantize.newImage.connect(imageSink.appendImage);
```

Note that, in this example, the sink of the pipeline 100 is a signal "newImage" connected to a property "appendImage" instead of a regular input/output Connection. The "yChop" property of the fft (fast Fourier transform) Node is explicitly connected to the "reconstruction.chop" Information associated with the incoming data through a key observer.

Key observation may also be used to dynamically reconstruct portions of the pipeline. For example, if the number of slices or coils changes as specified in the data, then a JavaScript function may be activated that reconstructs that section of the pipeline to have a number of branches that corresponds to the number of coils or slices. As pipeline branch points serve as opportunities for parallelism, this sort of structure can ensure that processor and memory resources are used efficiently.

Parallelism

Figure 4:
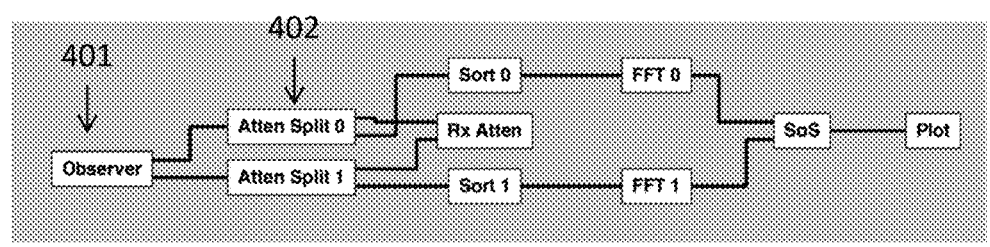
FIG. 4 shows a schematic of a reconstruction pipeline with two coils, in accordance with some embodiments.

When a reconstruction Node provides multiple outputs, these outputs may be parallelized across compute resources (e.g., central processing unit (CPU), graphics processing unit (GPU), coprocessor, ASIC, etc.). For example, in FIG. 4, the Observer source node 401 provides two outputs 402 for two coils of information. These coils may each be processed using a similar algorithm: split, then sort, then FFT. The "Split" function can also provide an opportunity for parallelization, allowing the "Rx Atten" Sink to execute as other processing progresses.

Parallelization can use a thread-pool architecture, placing each node onto a priority queue for processing as compute resources become available. In a heterogeneous CPU-GPU architecture, some blocks may be more well-suited for certain compute resources than others, or implementations may only be provided for certain compute resources. In either case, priority may be given according to the block's needs and the utilization of each resource queue. Independent tasks may be queued on an appropriate pool by each node, with each node scheduling one or more tasks in order to perform their processing function. Nodes with more complicated or parallelizable internal computations may break their computation into multiple tasks to be scheduled onto the pool. When multiple outputs are present on a node, processing for downstream connections and nodes may be placed onto the thread pool, and the source node may block its execution while providing an additional thread resource to the pool, to counterbalance its blocked execution. When only one output is connected to a node, queuing on the thread pool may be optional, as execution on the existing thread may be used to continue the propagation of execution to the downstream connection and node. As an optimization, any one of the outputs of a multi-output node may also utilize the existing thread for execution rather than pooling. To prevent deadlocks and undefined behavior, all blocks should either descend from a single Source block, or special synchronization blocks should be used whenever data from different asynchronous Sources is combined into a single block. Threads may be created as needed but maintained for the life of the reconstruction so that the overhead involved in creating threads can be minimized. Additional information on the usage of thread pools, and other methods for efficient parallelization of heterogeneous tasks, may be found in "C++ Concurrency in Action: Practical Multithreading" by Anthony Williams, the entirety of which is incorporated herein by reference.

After FFTs, these coils can be combined through a Sum-of-squares block that takes two inputs (one for each coil). Typically, these multi-input blocks need to wait for all inputs to be available before completing their processing, although any independent processing may occur in parallel as individual inputs arrive.

An entire MRI exam may consist of ten or more scans, each of which may require its own reconstruction algorithm. In a system where multiple reconstruction pipelines may be running at the same time, while yet other resources are being used for scanning the next set of data and visually reviewing prior data, each reconstruction algorithm preferably can dynamically adjust its resources to accommodate the needs of the entire system while prioritizing real-time communications with the scanner and user requests.

Each reconstruction pipeline may be implemented in its own process (e.g., program, App, executable, etc.) to minimize resource contention, prioritize pipelines at the system level, and to minimize the impact of a pipeline crash or stall. This "process model" also may isolate memory accesses between reconstructions at the system level, and can lead to increased software quality.

Pipeline Visualization

While pipelines are most conveniently written in code, it can be extremely helpful for the debugging, documentation, and teaching of pipeline creation to have a rich pipeline visualization structure. An exemplary pipeline visualizer 500 can show the complete topology of any given pipeline, as shown in FIG. 5.

The visualizer 500 may comprise a central view of the pipeline nodes and connections. To its left in FIG. 5 is a list 501 of all MRI Apps that are currently loaded with reconstructions; selecting between these Apps shows the different reconstruction pipelines for each App. Just below the pipeline view, viewer settings are available for setting the zoom level, refreshing the view (in case the pipeline topology has changed), printing, and closing this view.

Figure 5:
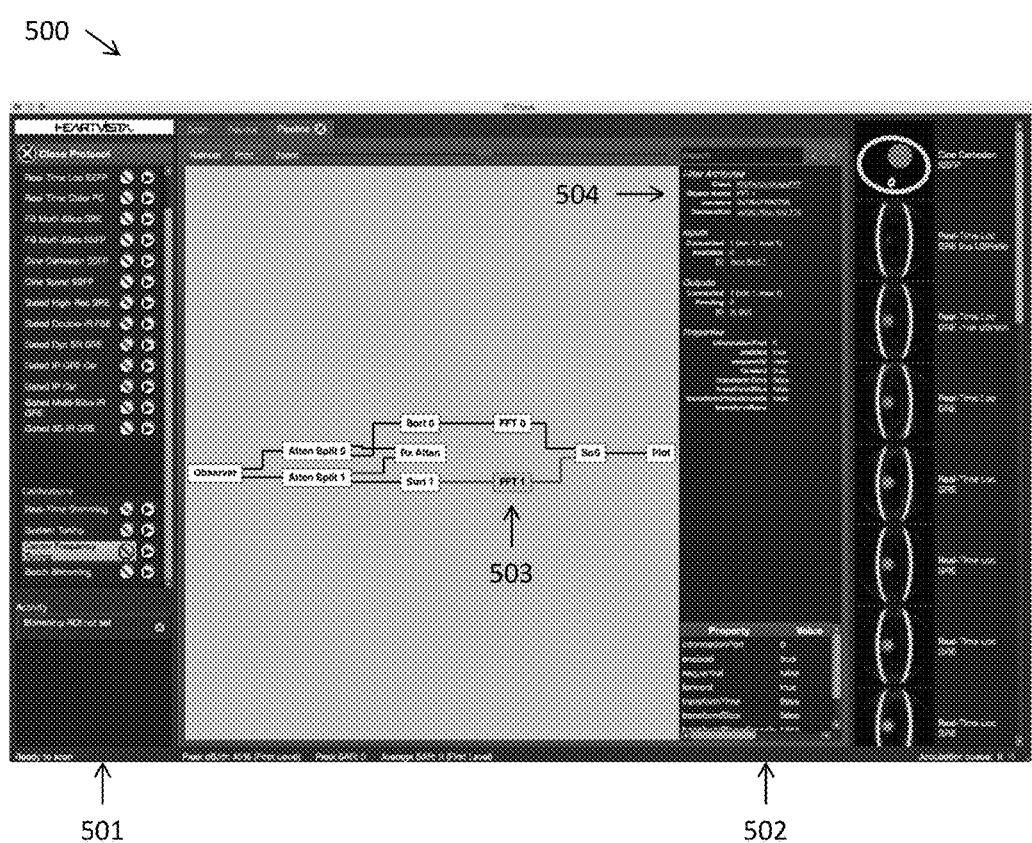
FIG. 5 shows an overview of a pipeline visualizer, in accordance with some embodiments.

To the right of the pipeline view in FIG. 5, an attributes panel 502 is visible, showing the attributes of the currently selected node (if any). In this screenshot of FIG. 5, the "FFT 1" node 503 is selected, and its "Filter Attributes" 504 are shown to the right. These attributes may comprise the C++ class name, object name, a pointer to the instance itself, and a link to the declaration in the source JavaScript. Clicking on this link can open an editor to the line at which the node was created.

If there were any Key Observer connections to this node, they can be listed in the attributes panel 502 as well. In addition, error states, links to developer documentation, and other block metadata can be made accessible through this node attributes view.

Inputs and outputs of the node may be listed, along with the nodes at the other end of each Connection. Clicking on the links "from Sort 1" or "to SoS" will change the current selection to the respective Connection object.

All Properties of the object may be listed and current values may be shown. The FFT node selected here may have a number of Boolean properties that can be viewed or changed through this interface. Changes to these properties may be synchronized with execution to safely allow property updates even as a reconstruction is in progress.

A tabbed interface at the top of the screen is provided to allow switching between this view and standard scanning and reviewing modes that can be used by the MR operator.

Connection Attributes

Figure 6:
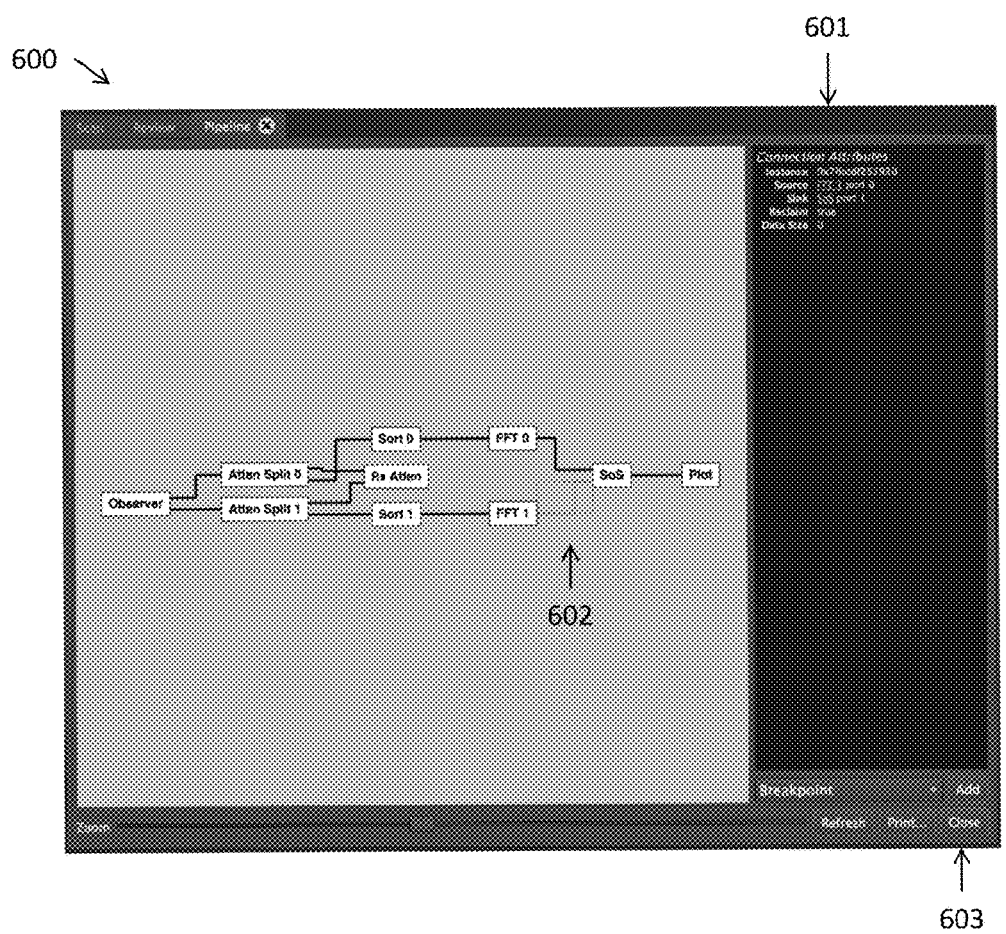
FIG. 6 shows a pipeline visualizer with a selected Connection, in accordance with some embodiments.

Connections 600 may also be selected, and their attributes 601 are shown in FIG. 6.

The selected Connection 602 is highlighted in FIG. 6. FIG. 6 shows its significant attributes as well, including instance pointer, source and sink nodes and ports (with links to select them), whether the data is reclaimed when processing is finished, and the current size of the data passing through. Below this view, a list 603 is provided to add a tracepoint to this connection, and if a tracepoint is associated, then this connection's Attributes can list its tracepoints. Tracepoints are discussed in detail below.

Error Conditions

Figure 7:
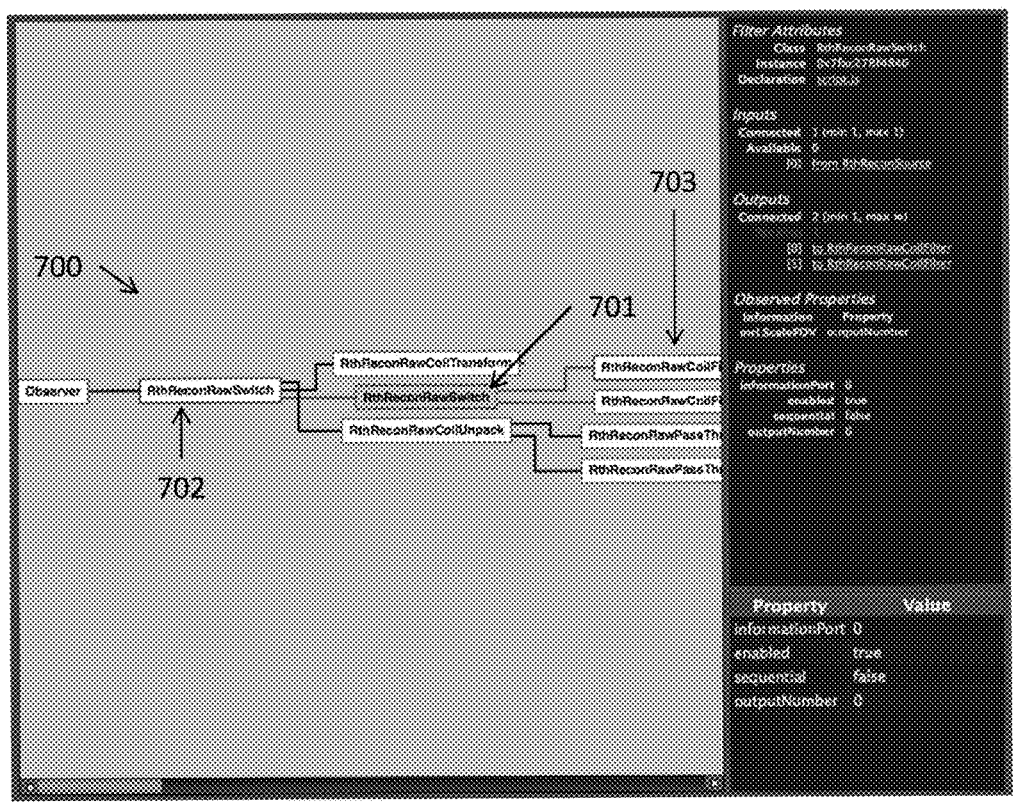
FIG. 7 shows a pipeline visualizer with a pipeline having a number of error conditions, in accordance some embodiments.

The pipeline viewer can also highlight any error conditions that are present in the pipeline for easy debugging. For example, a pipeline 700 with several error conditions is shown in FIG. 7. Here, the RthReconRawCoilTransform block 701 is shown with a dangling output—this Filter has no outputs and therefore its outputs may not be processed. The RthReconRawSwitch instances 702 also denote error conditions. One of these nodes may be selected, and it is shown to have one pending output. This can indicate that one output has not returned from its computation, and may be an indication that there is a problem with the processing downstream of this node. Indeed, since one of its RthReconCoilFilter outputs 703 is also outlined in color, there appears to be an incomplete computation along that path.

Figure 8:
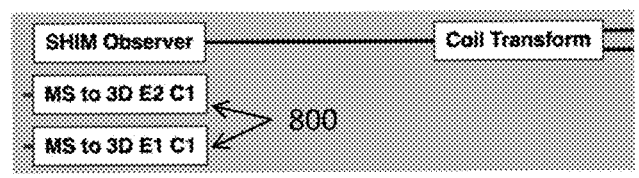
FIG. 8 shows a pipeline visualizer showing orphaned nodes, in accordance with some embodiments.

Further error condition information may be provided if any node explicitly returns with an error (in which case the error string may be shown along with the file and line number of the error). If memory may not be allocated for a block, or if non-finite (e.g., inf, NaN, subnormal) values are detected in the pipeline, other error conditions can be shown and associated with the Node, Connection, or Tracepoint where they were discovered. Nodes not collected by the JavaScript garbage collector are indicated as orphan nodes 800 without input or output connections, as shown in FIG. 8.

Navigating Complex Pipelines

Figure 9:
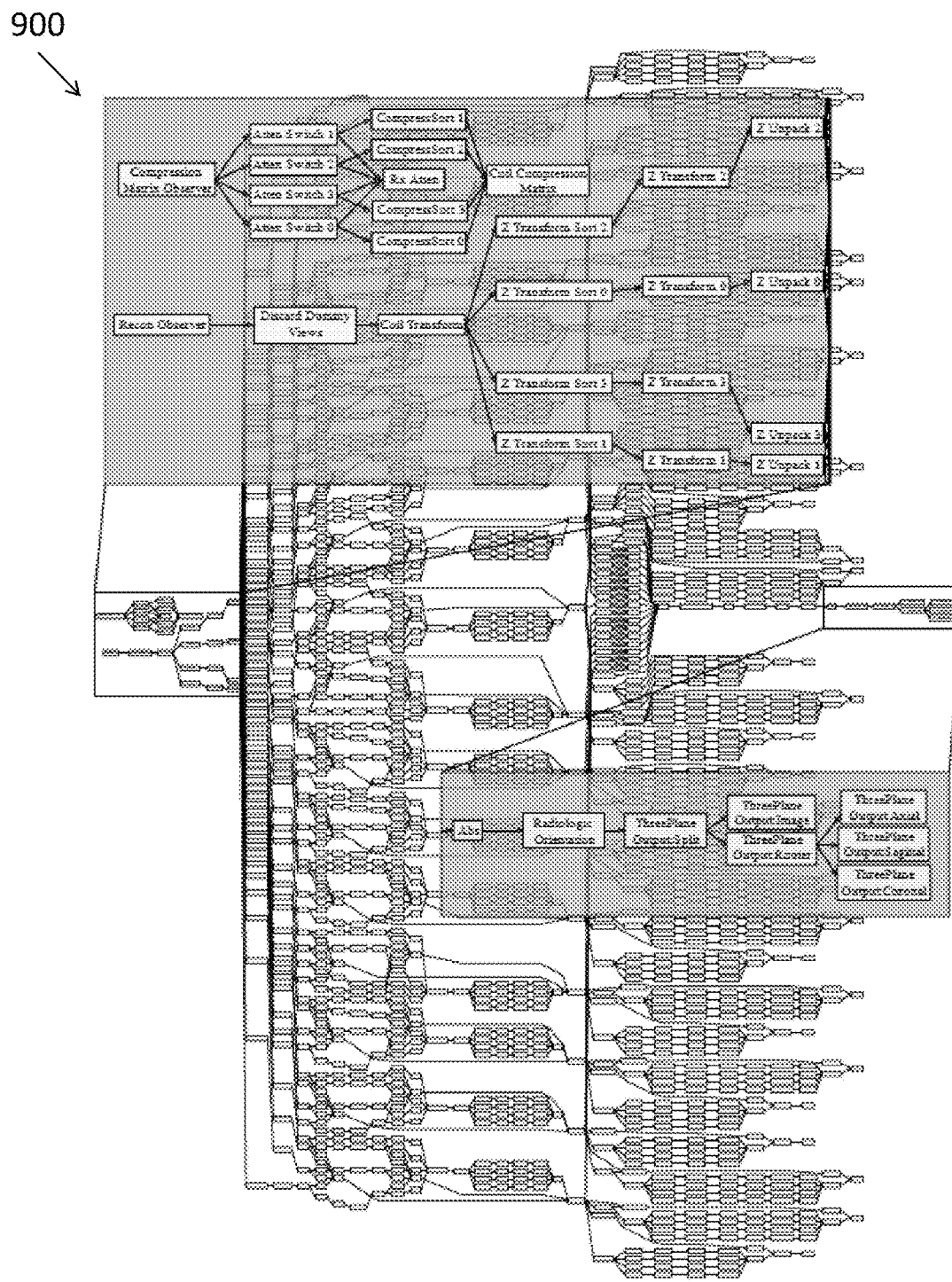
FIG. 9 shows a typical pipeline of a reconstruction engine, in accordance with some embodiments.

So far, all of the pipeline examples have had a small number of nodes, and are easily shown at once on screen. However, when moving from examples to a real, modern MRI reconstruction, pipeline complexity can increase dramatically. Many thousands of Nodes are not uncommon. For example, FIG. 9 shows a typical pipeline 900 used by a complex, real-life modern reconstruction engine. When viewing pipelines of this complexity, additional tools are needed to manage the complexity.

As discussed above, one method of managing complexity may be allowing the naming of pipeline nodes so that any node of interest can be given a meaningful name for display on the viewer. Whenever a node is not given a name explicitly, its class name can be used instead. Another small help can be gained by providing a "zoom" slider to show the pipeline at arbitrary size scales. Zooming and sliding the pipeline can be used to visually move to different sections of the algorithm.

Figure 10:
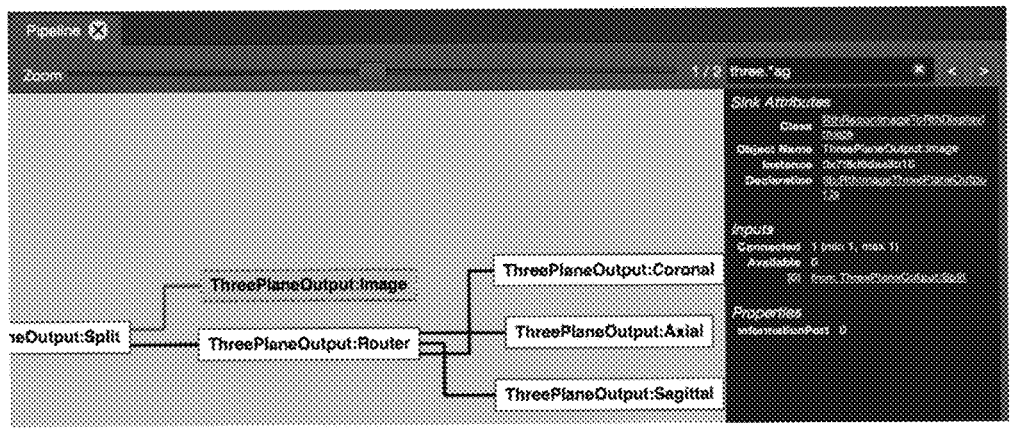
FIG. 10 shows a pipeline node search tool, in accordance with some embodiments.

Browser-style navigation tools can also be used to manage complex pipelines. Forward and back buttons may allow navigating through a sequence of previously selected nodes, multiple viewer tabs can show different reconstruction pipelines or different views on the same pipeline, and bookmarks can be used to return to a previously configured view. In addition, a search facility can be employed to allow the user to quickly search for and select nodes of a given class, or with a given name. For example, FIG. 10 depicts a search function user interface 1000, with the ability to search based upon common regular expressions and facilities for selecting between multiple search results.

To further simplify pipeline debugging, methods of showing the pipeline in variable detail may be provided. Usually, groups of Nodes with similar function are defined in a JavaScript object instance, and that JavaScript object may be duplicated at various points within the reconstruction. These objects may implicitly represent meta-Nodes, and these may be simplified into a single node as drawn on the viewer. The user can dictate further simplification by specifying Nodes that are to be grouped into a single meta-Node entity.

Once these multiple levels of detail are determined, the viewer can be set to display the pipeline information at highest detail (showing all Nodes), or lower detail (showing meta-Nodes in place of groups of Nodes). Meta-Nodes can be nested within each other, so a number of levels of detail can be provided for each reconstruction. Zooming can be integrated with variable detail, so that a reasonable number of nodes are shown on screen at each zoom level. Meta-nodes can also be manually expanded and collapsed by, for example, double-clicking on a collapsed meta-Node to reveal its contents.

Connections may also be collapsed in lower-detail views by drawing only one connection in place of a set of connections that all travel from and to the same nodes. These meta-Connections may be interrogated by selecting them, in which case the Attributes panel can describe the entire set of connections represented.

JavaScript Debugging

Figure 11:
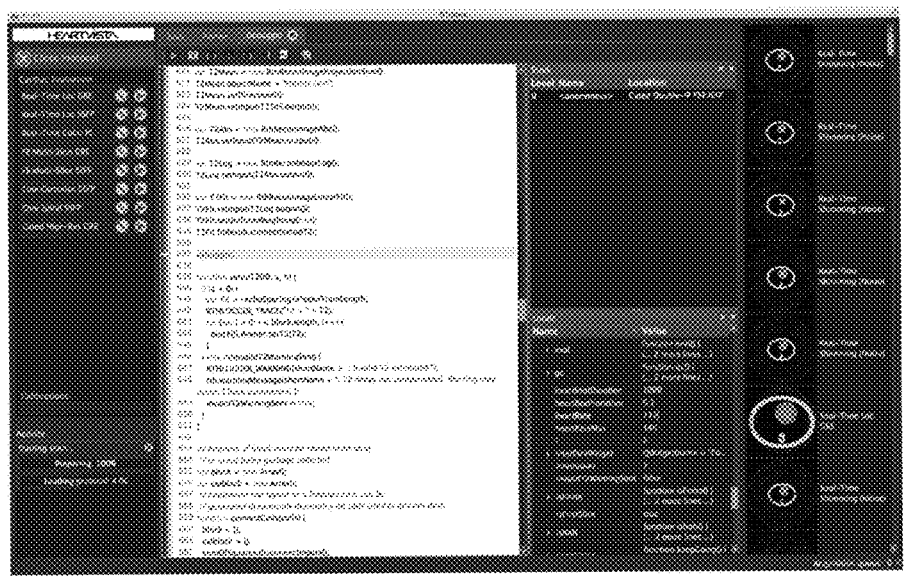
FIG. 11 shows a JavaScript debugger, in accordance with some embodiments.

A further method by which pipeline function may be interrogated is through the use of a JavaScript debugger 1100, as shown in FIG. 11.

This debugger 1100 may allow stepping through the declarative JavaScript, setting values, changing connections, injecting JavaScript expressions, and isolating JavaScript exceptions all within the interface of the running RTHawk executable. This debugger may be similar to others known broadly in the areas of computer programming and web design. By applying these principles to the field of MRI reconstructions, the process of developing new MRI algorithms can be greatly accelerated.

Pipeline Debugging

Although the JavaScript debugger applies well-known principles to the debugging of MRI reconstruction pipelines, it may be of limited usefulness in a declarative programming model because the JavaScript itself is only active when specifying the pipeline topology (e.g., at the time of construction and at the time of any dynamic change in algorithm). During primary data processing, the JavaScript may be idle as the algorithms are carried out by the pipeline Nodes and Connections themselves. The concepts of debugging need to be reconsidered in order to be applicable in this unique context.

For this task of pipeline debugging, the concept of pipeline Tracepoints is introduced, which can attach to Nodes or, preferably, Connections, and provide the user with many debugging abilities. A pipeline viewer 1200 indicating a number of attached Tracepoints is shown in FIG. 12.

Figure 12:
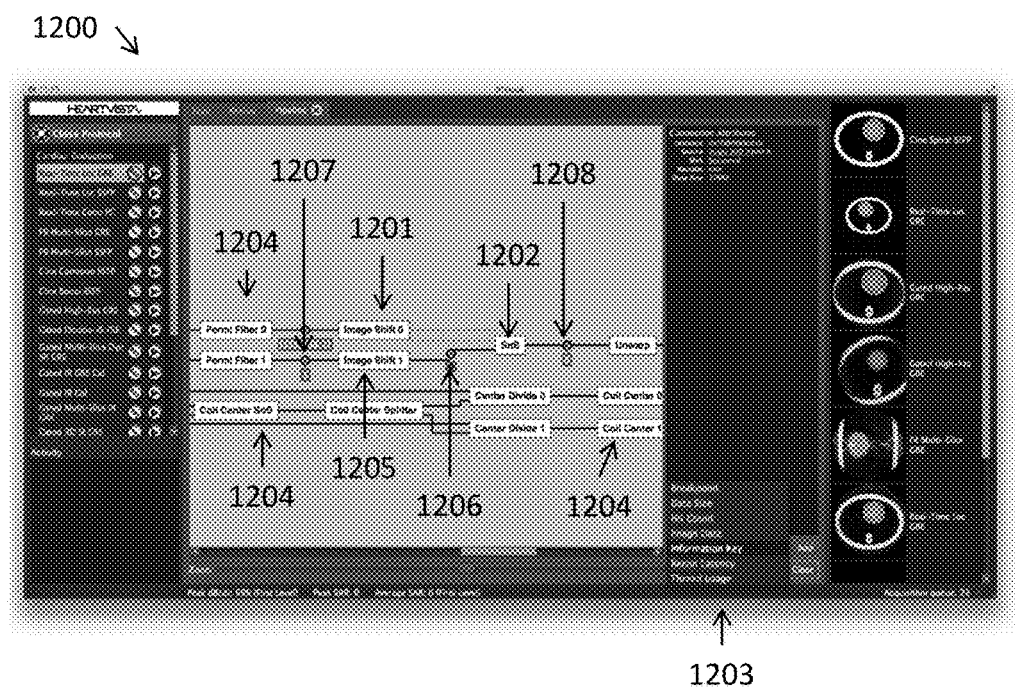
FIG. 12 shows a pipeline viewer indicating a number of attached Tracepoints, in accordance with some embodiments.

In FIG. 12, the Connection between "Image Shift 0" 1201 and "SoS" 1202 is selected, and at the lower right, a menu 1203 is opened showing some of the possible Tracepoints that may be attached to this Connection. On the pipeline display 1200 itself, other connections show Tracepoints that have already been attached; these tracepoints 1204 can be depicted by a gray-and-black circle with a Tracepoint-specific icon attached below.

Figure 13:
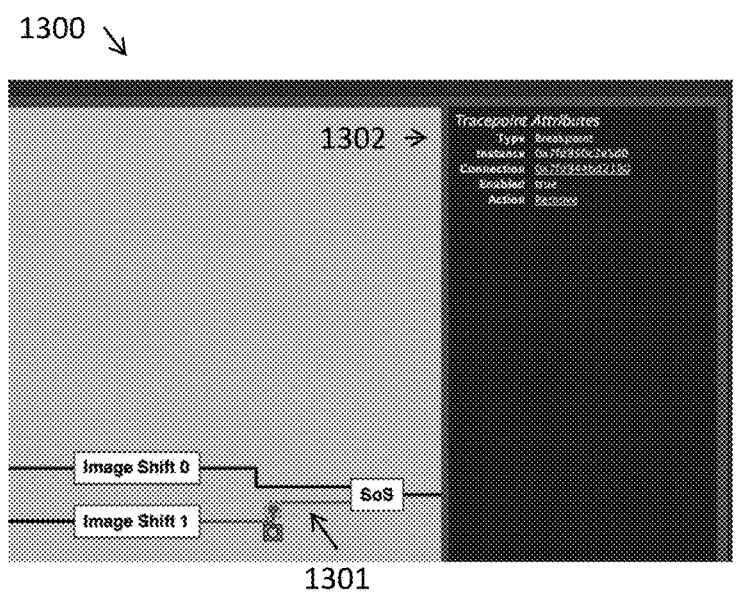
FIG. 13 shows a pipeline viewer with a selected Tracepoint and the displayed Tracepoint Attributes, in accordance with some embodiments.

Selecting a Tracepoint can lead to the Tracepoint Attributes screen 1300 shown in FIG. 13. The Tracepoint 1301 can be selected, and may be denoted by a circle atop the connection. Attributes 1302 may include the type of Tracepoint 1301 (along with a link to developer documentation), its instance pointer, a link to the associated Connection, its enabled status, and an option to remove the Tracepoint. In addition, different Tracepoint types may provide different data views, parameter changes, or actions.

Tracepoint Types

Tracepoints may operate on Data as it passes through the pipeline at the location of the Tracepoint. These operations are typically passive; that is, they do not modify the Data or Information as it passes. However, other types of Tracepoints may be used, as detailed herein.

Hit Count indicates the number of RthReconData objects that have passed this location in the pipeline. This is an extremely simple operation, but quite useful for understanding data flow in the pipeline (see FIG. 12).

Breakpoint can halt execution at the specified location in the pipeline, awaiting the user's instruction to continue. This can be useful to verify the progression of property values as data elements progress, or to search for data race conditions (see FIGS. 12 and 13). When a breakpoint is active, a "stack trace" may be provided which shows the series of upstream nodes that were active on this thread prior to this break.

Data Size can print the size and dimensionality of data passing through. For example, three-dimensional data may be indicated as "[128, 256, 16]" to indicate the number of elements in each dimension. This operation can be important in understanding how data are transformed through the pipeline (see FIG. 12).

Figure 14:
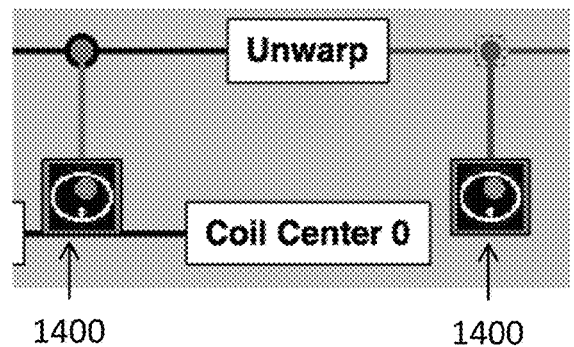
FIG. 14 shows an Image Data Tracepoint type, in accordance with some embodiments.

Image Data can save an image or images of the Data as it exists in the pipeline at this point. This operation is best applied to multi-dimensional data. The user may specify whether the magnitude, phase, or both are shown for complex data. This may be useful for ensuring that intermediate data results 1400 are as expected (FIG. 14).

Plot Data can save a plot or plots of the Data as it exists in the pipeline at this point. This operation may be best applied to single-dimensional data. The user may specify whether the magnitude, phase, or both are shown for complex data. This may be useful for ensuring that raw data acquisitions are as expected.

Figure 15:
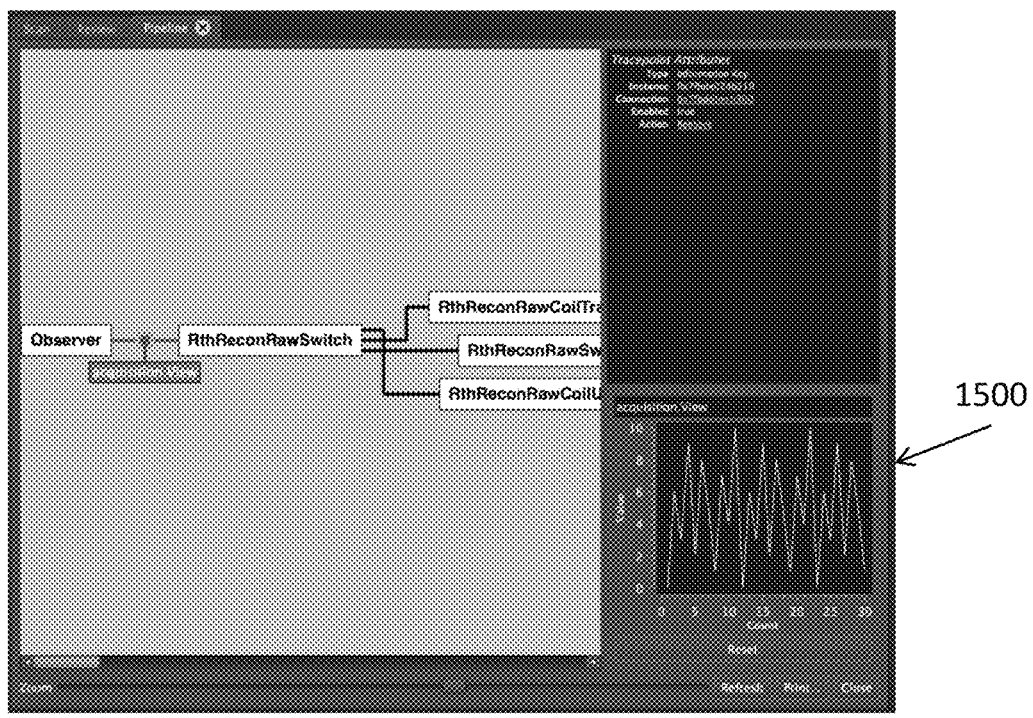
FIG. 15 shows an Information Key Tracepoint type, in accordance with some embodiments.

Information Key can show the current value, or a plot 1500 of historical values, of any information Key as it passes this point. For example, the "time since trigger" value of each raw data frame should progress deterministically with each data acquisition, until the next trigger is received. Data may be plotted with the independent axis corresponding to the count of data coming in or to the timestamp of acquisition or processing, as shown in FIG. 15. As a variation of this type, the entire information dictionary can be stored for each frame, and a search facility can be provided to allow easy discovery.

Recon Latency can indicate the time delay between when the data frame entered the pipeline and when the data arrived at the associated Connection. This can be used to determine the time required for processing across a number of nodes. Variations on this Tracepoint type can show the latency between two locations in the pipeline, or the latency of the pipeline from the selected location onward.

Thread Usage can indicate the number of threads that are currently being used by this reconstruction engine. This can be used to isolate inefficient sections of the pipeline, where not all processing resources are being utilized at once.

Log Completion can create a log message whenever the execution passes through the associated Connection. Logging can include a timestamp, Information values, Data sizes or contents, thread, memory, or other utilization, or any other data that can be discovered. This may be useful for interrogating subtle effects that cannot be easily visualized through other Tracepoint types.

Save To File may be similar to Image Data or Plot Data, but can save the incoming Data to a file, socket, or other stream destination. This tracepoint type may be useful for data processing using alternative tools. For example, MATLAB provides a streaming toolkit which may be set up to receive data at any stage of reconstruction for additional processing. Alternatively or in combination, files may be saved in a file format that is readable by external tools for later processing.

Modify Data can substitute synthetic data, or zero data, for incoming data frames to facilitate certain testing. Additional data may also be injected at user request.

Insert Delay can introduce a delay into the pipeline at this location of a specified duration. This can be useful for debugging race conditions and threading instabilities.

Memory Allocations can indicate the amount of memory currently allocated by the running reconstruction engine. This can be used to isolate memory-inefficient sections of the pipeline, or locations where memory leaks may be occurring. Specific memory statistics such as churn, paging, and virtual memory usage may also be detailed here.

Throughput may provide an estimate of the pipeline throughput at this point. The operation can simply compute a time difference between subsequent executions, or can make a calculation of total processing time on this branch. This may be useful for determining the maximum reconstruction rate for a particular reconstruction algorithm (e.g., real-time scans).

A plugin API can be provided to allow the creation of arbitrary new tracepoint types.

Tracepoint Properties

Multiple Tracepoints can be attached to a single Connection, and the composition of Tracepoints can provide powerful insights. For example, in the pipeline 1200 of FIG. 12, a Breakpoint 1206 has been added between "Image Shift 1" 1205 and "SoS" 1202. This breakpoint 1206 has halted execution after only one Data object passed into "Image Shift 1" 1205, as seen by the Hit Count 1207 going into that block. The Breakpoint 1206 has not allowed any data to pass, which can be seen because the Hit Count 1208 on the output of SoS remains at 0 (SoS waits for all inputs to be available before propagating outputs).

Each Tracepoint type may be converted into a "Conditional Tracepoint" by adding a JavaScript condition on its enabled status. For example, it may be desirable to set a condition on a Breakpoint so that it only breaks execution for data arising from Slice number 4. To accomplish this, the exemplary JavaScript snippet below can be invoked:

```
connection.observeValueForKey("acquisition.Slice",
function(value) {
  if(value===4) breakpoint.enabled = true;
  else breakpoint.enabled = false;
});
```

This JavaScript can be created, modified, and removed all from within the user interface (a benefit of using an interpreted language). If a compiled language is desired, Conditional Tracepoints may also be implemented by setting a range on an information value upon which to activate.

Additional Debugging Tools

The aforementioned JavaScript and Pipeline debugging tools may be useful for tracking problems in specific regions of code or portions of the pipeline. When more global measures are desired, different debugging tools may be desirable.

Timing Diagrams

Figure 16:
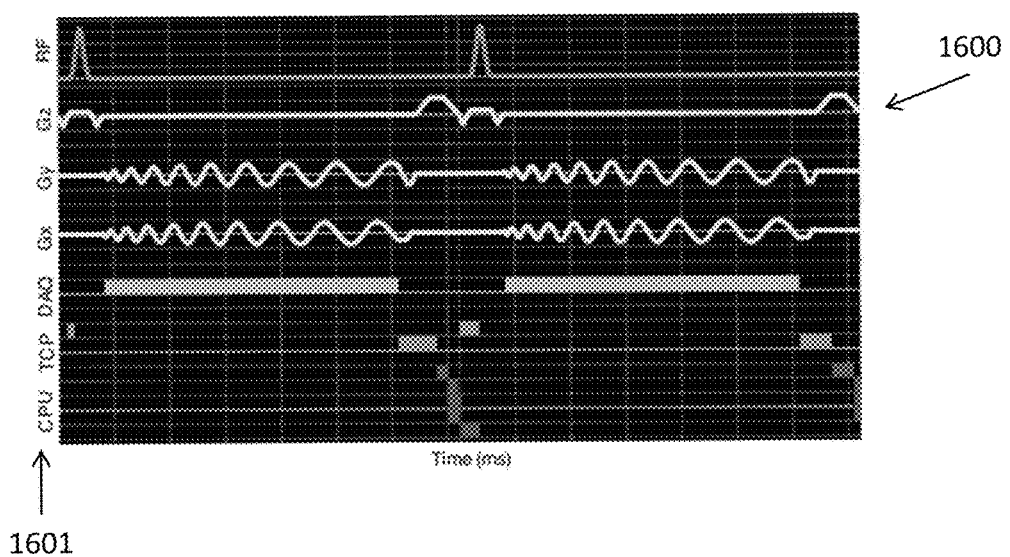
FIG. 16 shows a Timing Diagram indicating the processing time required for a real-time spiral sequence, in accordance with some embodiments.

Timing diagrams 1600 as depicted in FIG. 16 can be useful for visualizing processing time required for various portions of the entire sequencing, data collection, sampling, transmission, and reconstruction process. Standard sequence timing diagrams for X, Y, and Z gradients in addition to RF transmit can be augmented by including data acquisition timing, timing of network transmit of the collected data (denoted as "TCP" here, but can be UDP, VME bus, infiniband, or any other data transmission protocol). Also shown are packets of information sent to the sequencer for real-time or asynchronous updating of the sequencing parameters. Pipeline and other processing is shown here in FIG. 16 under the "CPU" heading 1601, but may also occur on GPU, stream processor, dedicated hardware, or any other computation resource.

With all actions shown in a single place, with accurate timing as they occurred, bottlenecks in data throughput can be readily identified. For real-time display of MRI data, any delays or wasted time can prevent the system from staying in synchrony with the data acquisition. Furthermore, optimizing these timings may also be important to ensure that time-sensitive sequencing updates are delivered to the scanner in time for application in a specific TR interval. Respiratory, ECG, and triggering information may also be displayed on this timing graph for additional context, along with any other time-based information that interacts with the acquisition timing.

In this data view of FIG. 16, clicking on any specific timing element reveals an Attributes view that provides additional information about the source of the timing delay. For example, each "CPU" block here is linked to the processing of a specific pipeline node or meta-Node whose information may be displayed upon user request.

Pipeline Profiler

A software profiler (e.g., sampling profiler, instrumentation profiler, hypervisor, or other method for dynamic program analysis) for the reconstruction pipeline can sample processor (CPU, GPU, etc.) activity at regular intervals and compile a list of which nodes were processing on each resource at each sample time. These samples can then be analyzed to assess various properties, as detailed below.

Global thread pool occupancy: Graphical information can be shown to depict the proportion of global thread resources that are in use at each sample time, the number that are blocked waiting for other processing, and the number that are idle. Averages and other statistical information may also be derived over specified time intervals.

Relative processing time required by each reconstruction Node and Node type: Nodes in a pipeline can be ranked by the number of samples collected while that node was processing. This information can be valuable for determining processing bottlenecks, and for deciding where additional optimizations may be most beneficial. Average computation time and other statistical measures may be derived from these values.

Stack traces of nodes processing at any sample: Beyond the knowledge of which node is processing at a given time, it may be useful to also understand the call stack of the processing resource at that time. This information can be used to further direct optimization effort.

Relative usage of the processing resources by each of multiple reconstruction pipelines, when multiple pipelines are simultaneously running: Simple global measures like these can be plotted against time, or a real-time assessment can be shown in the interface. In a preferred embodiment, an App "Badge" can be displayed on each MR App in a Protocol to show current relative and absolute processing requirements for the App.

Memory Allocations

A similar software profiler can also be provided for memory allocations and memory leaks. At each sampling point, the memory usage of the pipeline as a whole can be assessed, including information about memory requirements of each Node. Memory that is allocated for a pipeline but is not associated with any currently active node can be marked as "leaked". As above, stack traces, relative memory requirements for each Node and Node type, and App Badges can be utilized for displaying and interpreting memory usage information.

Notebook Interface

A so-called "Notebook" interface in the spirit of iPython, Mathematica, and other similar tools may be useful for specifying reconstructions interactively. This may be useful for debugging, for teaching, or for demonstration purposes.

In a specific embodiment, this can include an on-line JavaScript interpreter command line allowing specification of pipeline Nodes and Tracepoints. JavaScript commands can also be provided to show the pipeline visualizer in-line (or a portion of it), sequencing waveforms, timing diagrams, and visual representations of the data.

Logging and Assertions

Log messages and assertions raised by the pipeline may also be collected in a centralized location, searchable, and sortable. Log messages may be tagged with a time stamp, severity level, type and name of the originating Node, and specific information about the event. Because log messages often "cascade" from a single error source to additional downstream effects, the log visualizer can attempt to highlight the first log message in a related series of events.

MRI Simulator

An MRI simulator may be provided to allow debugging and analysis of the pipeline operation in the absence of an MRI machine. This simulator may use the Bloch equations for more accurate simulation of magnetic resonance phenomena, or a Fourier or other method may be used to simplify processing. Multiple coils may be simulated, and various parameters of the simulation may be user-programmable via a Preferences interface.

This strategy can be applied across all magnetic resonance applications. Imaging, spectroscopy, pre-scan calibrations, reference scans, and any other data analysis operation can benefit from these tools. For applications outside of MRI reconstruction, alternative domain-specific Node structures, Tracepoint types, and other building blocks may be needed.

This comprehensive pipeline-based approach is novel in this field and aims to substantially reduce the time required to complete these essential operations in the process. These domain-specific solutions should provide significant improvements over the conventional approaches of manual code analysis, command-line debugging, and logging messages.

Control Systems

Figure 17:
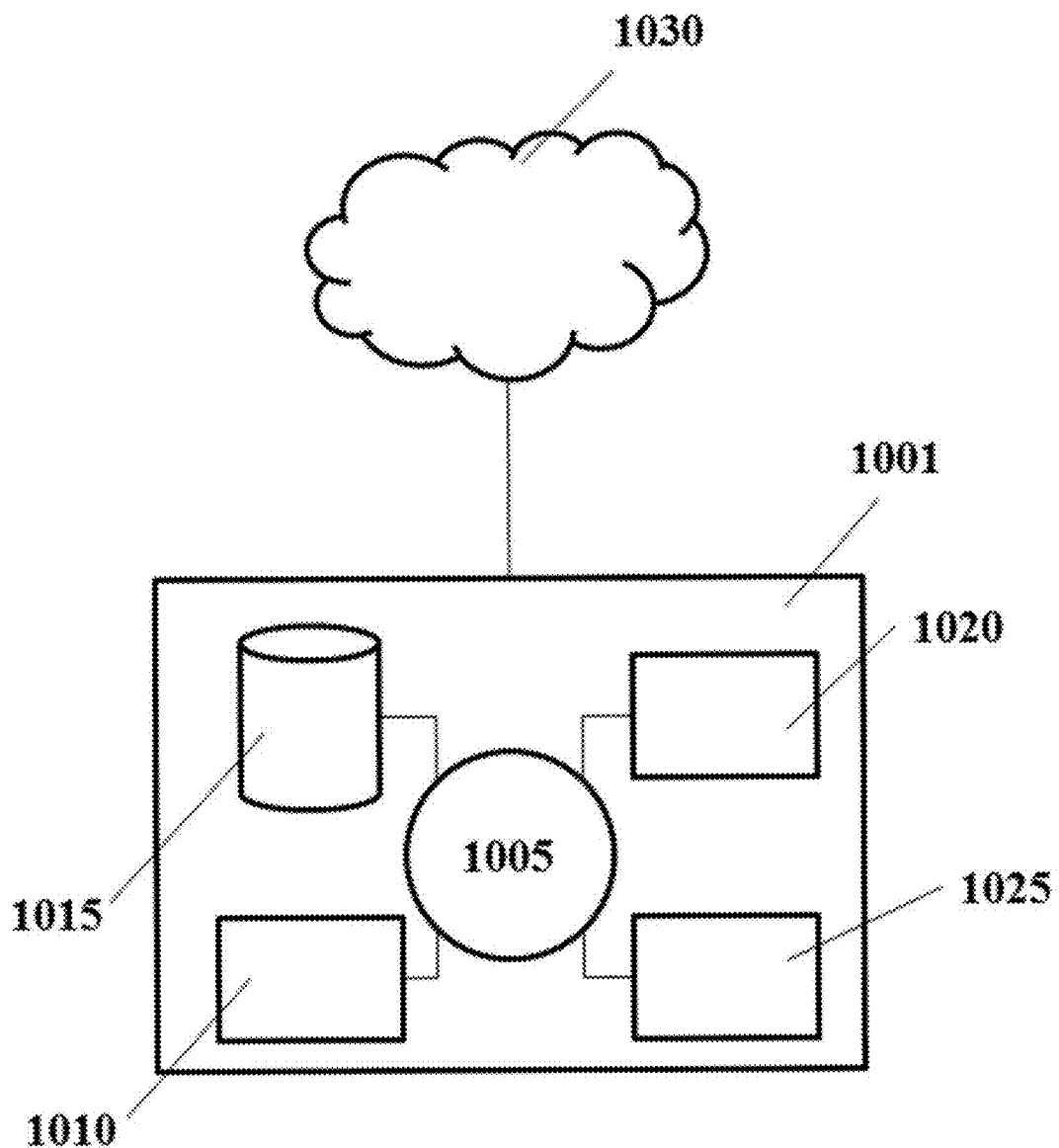
FIG. 17 shows a schematic of a networked computer system that is programmed or otherwise configured to implement methods and systems of the present disclosure.

The present disclosure also provides computer control systems that are programmed to implement methods of the disclosure. FIG. 17 shows a computer system 1001 that is programmed or otherwise configured to implement the MRI data reconstruction as described herein. The computer system 1001 can regulate various aspects of data processing of the present disclosure, such as, for example, data reconstruction and debugging.

The computer system 1001 includes a central processing unit (CPU, also "processor" and "computer processor" herein) 1005, which can be a single core or multi core processor, or a plurality of processors for parallel processing. The computer system 1001 also includes memory or memory location 1010 (e.g., random-access memory, read-only memory, flash memory), electronic storage unit 1015 (e.g., hard disk), communication interface 1020 (e.g., network adapter) for communicating with one or more other systems, and peripheral devices 1025, such as cache, other memory, data storage and/or electronic display adapters. The memory 1010, storage unit 1015, interface 1020 and peripheral devices 1025 are in communication with the CPU 1005 through a communication bus (solid lines), such as a motherboard. The storage unit 1015 can be a data storage unit (or data repository) for storing data. The computer system 1001 can be operatively coupled to a computer network ("network") 1030 with the aid of the communication interface 1020. The network 1030 can be the Internet, an internet and/or extranet, or an intranet and/or extranet that is in communication with the Internet. The network 1030 in some cases is a telecommunication and/or data network. The network 1030 can include one or more computer servers, which can enable distributed computing, such as cloud computing. The network 1030, in some cases with the aid of the computer system 1001, can implement a peer-to-peer network, which may enable devices coupled to the computer system 1001 to behave as a client or a server.

The CPU 1005 can execute a sequence of machine-readable instructions, which can be embodied in a program or software. The instructions may be stored in a memory location, such as the memory 1010. The instructions can be directed to the CPU 1005, which can subsequently program or otherwise configure the CPU 1005 to implement methods of the present disclosure. Examples of operations performed by the CPU 1005 can include fetch, decode, execute, and writeback.

The CPU 1005 can be part of a circuit, such as an integrated circuit. One or more other components of the system 1001 can be included in the circuit. In some cases, the circuit is an application specific integrated circuit (ASIC).

The storage unit 1015 can store files, such as drivers, libraries and saved programs. The storage unit 1015 can store user data, e.g., user preferences and user programs. The computer system 1001 in some cases can include one or more additional data storage units that are external to the computer system 1001, such as located on a remote server that is in communication with the computer system 1001 through an intranet or the Internet.

The computer system 1001 can communicate with one or more remote computer systems through the network 1030. For instance, the computer system 1001 can communicate with a remote computer system of a user (e.g., operator). Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 1001 via the network 1030.

Methods as described herein can be implemented by way of machine (e.g., computer processor) executable code stored on an electronic storage location of the computer system 1001, such as, for example, on the memory 1010 or electronic storage unit 1015. The machine executable or machine readable code can be provided in the form of software. During use, the code can be executed by the processor 1005. In some cases, the code can be retrieved from the storage unit 1015 and stored on the memory 1010 for ready access by the processor 1005. In some situations, the electronic storage unit 1015 can be precluded, and machine-executable instructions are stored on memory 1010.

The code can be pre-compiled and configured for use with a machine have a processor adapted to execute the code, or can be compiled during runtime. The code can be supplied in a programming language that can be selected to enable the code to execute in a pre-compiled or as-compiled fashion.

Aspects of the systems and methods provided herein, such as the computer system 1001, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 1001 can include or be in communication with an electronic display that comprises a user interface (UI) for providing, for example, reconstruction pipeline visualization and control as shown in FIGS. 5-14. Examples of UI's include, without limitation, a graphical user interface (GUI) and web-based user interface.

Methods and systems of the present disclosure can be implemented by way of one or more algorithms. An algorithm can be implemented by way of software upon execution by one or more computer processors. Results (e.g., data) generated upon the execution of the algorithm can be stored in memory. Some examples of algorithms used in the MRI reconstruction engine as described herein include JavaScript reconstruction algorithms as described, and various debugging algorithms such as those used to implement the various tracepoint types described.

Methods and systems of the present disclosure may be combined with and/or modified by other methods and systems, such as those described in Santos, J. M.; Wright, G. A.; Pauly, J. M., "Flexible real-time magnetic resonance imaging framework," Engineering in Medicine and Biology Society, 2004. IEMBS '04. 26th Annual International Conference of the IEEE, vol. 1, no., pp. 1048, 1051, 1-5 Sep. 2004doi: 10.1109/IEMBS.2004.1403343, in addition to WO 2014/039080 A1, WO 2005/008269 A1, U.S. Pat. No. 5,465,361, U.S. Pat. No. 5,512,825, U.S. Pat. No. 6,020,739, U.S. Pat. No. 6,025,717, U.S. Pat. No. 6,198,282, U.S. Pat. No. 7,102,349, and U.S. Pat. No. 7,053,614, each of which is entirely incorporated herein by reference.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method for imaging a subject, comprising:
generating, with a computing system, an image of the subject based on a raw MRI data set,
wherein the image is generated by:
(i) providing a plurality of processing nodes in the computer system, each of the plurality of processing nodes comprising one or more processing tasks for data transformation, one or more inputs, and one or more outputs,
(ii) linking two or more of the processing nodes to form a functional pipeline, wherein the functional pipeline is configured to generate image data from the raw MRI data set and the functional pipeline further comprises one or more branches,
(iii) dynamically prioritizing, with the computer system, a computing resource of the computing system for one or more select processing nodes of the functional pipeline based at least in part on one or more of at least one of the inputs of the one or more select processing nodes, at least one of the outputs of the one or more select processing nodes, a content of the one or more select processing nodes, a node connection attribute of the one or more select processing nodes, or a topology of the functional pipeline; and
displaying, on a display in communication with the computing system, a graphical user interface showing at least a portion of the functional pipeline, wherein the graphical user interface allows a user to query at least one of the linked processing nodes or a node connection between two linked processing nodes so as to debug or configure the one or more processing nodes.

2. The method of claim 1, wherein the prioritized computing resource comprises one or more of a processing resource of the computing system, a memory resource of the computing system, one or more computer workstations of the computer system, one or more computer processing cores of the computing system, one or more graphics processing unit threads of the computing system, or one or more stream processors of the computing system.

3. The method of claim 1, wherein dynamically prioritizing the computing resource comprises dynamically reconfiguring the functional pipeline based on one or more of at least one of the inputs of the one or more select processing nodes, at least one of the outputs of the one or more select processing nodes, a content of the one or more select processing nodes, a node connection attribute of the one or more select processing nodes, or a topology of the functional pipeline.

4. The method of claim 3, wherein the content of the one or more select processing nodes comprises one or more of complex-valued data arranged in one or more dimensions or metadata relevant to at least one of the collection, processing, display, and subject characteristics related to the one or more select processing nodes.

5. The method of claim 1, wherein the computing resource is prioritized using a thread-pool architecture.

6. The method of claim 1, wherein the displayed graphical user interface further shows a profile indicating resource utilization of the computing system.

7. The method of claim 6, wherein the profile comprises a sampling profile including a count of relative samples acquired which at least one of the processing nodes is in execution.

8. The method of claim 1, wherein the at least one of the linked processing nodes and the node connection between two linked processing nodes is queried by using a tracepoint.

9. The method of claim 8, wherein the tracepoint comprises one or more of a hit counter, a breakpoint, a data size, a plot data, an image data, an information key, a recon latency, a thread usage, a log completion, a save to file, a modify data, an insert delay, a memory allocation, or a throughput.

10. The method of claim 1, wherein the graphical user interface further provides a visual tool for at least one of debugging and documentation.

11. The method of claim 1, wherein the graphical user interfaces displays a timing diagram of at least one of the conditioning and measuring operations.

12. A system for imaging a subject, comprising:
a computing system comprising memory storing a set of instructions that, when executed by a computer processor of the computing system, causes the computing system to compile measured radiofrequency signals into a raw MRI data set, generate an image of the subject based on the raw MRI data set, and display the generated image,
wherein the image of the subject based on the raw MRI data set is generated by:
(i) providing a plurality of processing nodes in the computer system, each comprising one or more processing tasks for data transformation, one or more inputs, and one or more outputs, (ii) linking two or more of the processing nodes to form a functional pipeline, wherein the functional pipeline is configured to generate image data from the raw MRI data set and the functional pipeline further comprises one or more branches, (iii) dynamically prioritizing, with the computer system, a computing resource of the computing system for one or more select processing nodes of the functional pipeline based on one or more of at least one of the inputs of the one or more select processing nodes, at least one of the outputs of the one or more select processing nodes, a content of the one or more select processing nodes, a node connection attribute of the one or more select processing nodes, or a topology of the functional pipeline, and
displaying, on a display in communication with the computing system, a graphical user interface showing at least a portion of the functional pipeline, wherein the graphical user interface allows a user to query at least one of the linked processing nodes or a node connection between two linked processing nodes so as to debug or configure the one or more processing nodes.

13. The system of claim 12, wherein the prioritized computing resource comprises one or more of a processing resource of the computing system, a memory resource of the computing system, one or more computer workstations of the computer system, one or more computer processing cores of the computing system, one or more graphics processing unit threads of the computing system, or one or more stream processors of the computing system.

14. The system of claim 12, wherein prioritizing the computing resource comprises dynamically reconfiguring the functional pipeline based on one or more of at least one of the inputs of the one or more select processing nodes, at least one of the outputs of the one or more select processing nodes, a content of the one or more select processing nodes, a node connection attribute of the one or more select processing nodes, or a topology of the functional pipeline.

15. The system of claim 14, wherein the content of the one or more select processing nodes comprises one or more of complex-valued data arranged in one or more dimensions or metadata relevant to at least one of the collection, processing, display, and subject characteristics related to the one or more select processing nodes.

16. The system of claim 12, wherein the computing resource is prioritized using a thread-pool architecture.

17. The system of claim 12, wherein the displayed graphical user interface further shows a profile indicating resource utilization of the computing system.

18. The system of claim 17, wherein the profile comprises a sampling profile including a count of relative samples acquired which at least one of the processing nodes is in execution.

19. The system of claim 12, wherein the at least one of the linked processing nodes and the node connection between two linked processing nodes is queried by using a tracepoint.

20. The system of claim 19, wherein the tracepoint comprises one or more of a hit counter, a breakpoint, a data size, a plot data, an image data, an information key, a recon latency, a thread usage, a log completion, a save to file, a modify data, an insert delay, a memory allocation, or a throughput.

21. The system of claim 12, wherein the graphical user interfaces displays a timing diagram of at least one of the conditioning and measuring operations.

22. A non-transitory computer readable medium comprising machine executable code that, upon execution by one or more computer processors, implements a method for imaging a subject, the method comprising:
generating, using a computing system, an image of the subject based on a raw MRI data set, wherein the image is generated by (i) providing a plurality of processing nodes in the computing system, each of the plurality of processing nodes comprising one or more processing tasks for data transformation, one or more inputs, and one or more outputs, (ii) linking two or more of the processing nodes to form a functional pipeline, wherein the functional pipeline is configured to generate image data from the raw MRI data set and the functional pipeline further comprises one or more branches, (iii) dynamically prioritizing, with the computer system, a computing resource of the computing system for one or more select processing nodes of the functional pipeline based at least in part on one or more of at least one of the inputs of the one or more select processing nodes, at least one of the outputs of the one or more select processing nodes, a content of the one or more select processing nodes, a node connection attribute of the one or more select processing nodes, or a topology of the functional pipeline; and
displaying, on a display in communication with the computing system, a graphical user interface showing at least a portion of the functional pipeline, wherein the graphical user interface allows a user to query at least one of the linked processing nodes or a node connection between two linked processing nodes so as to debug or configure the one or more processing nodes.

23. The method of claim 1, wherein the raw MM data set was generated by (a) conditioning, with an imaging apparatus, nuclear spins in the subject, (b) measuring, with the imaging apparatus, radiofrequency signals generated from the subject in response to the nuclear spins conditioned in (a), and (c) compiling the measured radiofrequency signals into a raw MRI data set.

24. The method of claim 1, wherein the topology of the functional pipeline is dynamically reconstructed in response to a change in the inputs of the one or more select processing nodes or a change in the one or more processing tasks for data transformation.

* * * * *